United States Patent
Ching et al.

(10) Patent No.: US 8,927,362 B2
(45) Date of Patent: Jan. 6, 2015

(54) CMOS DEVICE AND METHOD OF FORMING THE SAME

(71) Applicant: Taiwan Semiconductor Manufacturing Company, Ltd., Hsin-Chu (TW)

(72) Inventors: Kuo-Cheng Ching, Zhubei (TW); Shi Ning Ju, Hsinchu (TW); Cary Chia-Chiung Lo, Taipei (TW); Huicheng Chang, Tainan (TW); Chun Chung Su, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/170,102

(22) Filed: Jan. 31, 2014

(65) Prior Publication Data
US 2014/0141582 A1  May 22, 2014

Related U.S. Application Data

(62) Division of application No. 13/473,149, filed on May 16, 2012, now Pat. No. 8,680,576.

(51) Int. Cl.
*H01L 21/8238* (2006.01)
*H01L 21/76* (2006.01)
*H01L 27/092* (2006.01)

(52) U.S. Cl.
CPC *H01L 21/823821* (2013.01); *H01L 21/823807* (2013.01); *H01L 21/823878* (2013.01); *H01L 27/0922* (2013.01); *H01L 27/0924* (2013.01)
USPC 438/218; 438/400; 257/E21.09; 257/E29.068

(58) Field of Classification Search
CPC .............................................. H01L 21/823821
USPC .............. 438/400, 218; 257/E21.09, E29.068
See application file for complete search history.

(56) References Cited

U.S. PATENT DOCUMENTS

| | | | |
|---|---|---|---|
| 5,479,033 A | 12/1995 | Baca et al. | |
| 6,339,232 B1 | 1/2002 | Takagi et al. | |
| 7,198,995 B2 | 4/2007 | Chidambarrao et al. | |
| 7,238,989 B2 | 7/2007 | Yeo et al. | |
| 7,247,534 B2 | 7/2007 | Chidambarrao et al. | |
| 7,700,416 B1 * | 4/2010 | Clifton et al. | 438/142 |
| 7,968,910 B2 | 6/2011 | Chen et al. | |
| 8,062,963 B1 | 11/2011 | Dal et al. | |
| 8,183,667 B2 | 5/2012 | Park et al. | |
| 8,232,186 B2 | 7/2012 | Harley et al. | |
| 8,344,242 B2 | 1/2013 | Fiorenza et al. | |

(Continued)

*Primary Examiner* — David S Blum
(74) *Attorney, Agent, or Firm* — Haynes and Boone, LLP

(57) ABSTRACT

A semiconductor device and method for fabricating a semiconductor device is disclosed. An exemplary semiconductor device includes a substrate including a first region and a second region. The semiconductor device further includes a first buffer layer formed over the substrate and between first and second isolation regions in the first region and a second buffer layer formed over the substrate and between first and second isolation regions in the second region. The semiconductor device further includes a first fin structure formed over the first buffer layer and between the first and second isolation regions in the first region and a second fin structure formed over the second buffer layer and between the first and second isolation regions in the second region. The first buffer layer includes a top surface different from a top surface of the second buffer layer.

20 Claims, 10 Drawing Sheets

(56) References Cited

U.S. PATENT DOCUMENTS

| | | |
|---|---|---|
| 2003/0172866 A1 | 9/2003 | Hsu et al. |
| 2003/0227013 A1 | 12/2003 | Currie et al. |
| 2004/0040493 A1 | 3/2004 | Vineis et al. |
| 2004/0212035 A1 | 10/2004 | Yeo et al. |
| 2004/0227169 A1 | 11/2004 | Kubo et al. |
| 2005/0156268 A1 | 7/2005 | Chu et al. |
| 2005/0196925 A1 | 9/2005 | Kim et al. |
| 2005/0205929 A1 | 9/2005 | Nagano et al. |
| 2005/0217566 A1 | 10/2005 | Mantl et al. |
| 2006/0113603 A1 | 6/2006 | Currie et al. |
| 2006/0145264 A1 | 7/2006 | Chidambarrao et al. |
| 2006/0172495 A1* | 8/2006 | Zhu et al. ..................... 438/275 |
| 2007/0025670 A1 | 2/2007 | Pan et al. |
| 2007/0032009 A1 | 2/2007 | Currie et al. |
| 2007/0166897 A1 | 7/2007 | Chidambarrao et al. |
| 2007/0170507 A1 | 7/2007 | Zhu et al. |
| 2007/0181977 A1* | 8/2007 | Lochtefeld et al. ........... 257/618 |
| 2007/0196987 A1 | 8/2007 | Chidambarrao et al. |
| 2007/0212879 A1* | 9/2007 | Grasby et al. ................. 438/680 |
| 2007/0224787 A1 | 9/2007 | Weeks et al. |
| 2008/0061317 A1 | 3/2008 | Cheng et al. |
| 2008/0099785 A1 | 5/2008 | Bai et al. |
| 2009/0321882 A1* | 12/2009 | Park .............................. 257/615 |
| 2010/0044754 A1* | 2/2010 | Boyanov et al. .............. 257/192 |
| 2011/0180847 A1 | 7/2011 | Ikeda et al. |
| 2012/0098034 A1 | 4/2012 | Park et al. |

\* cited by examiner

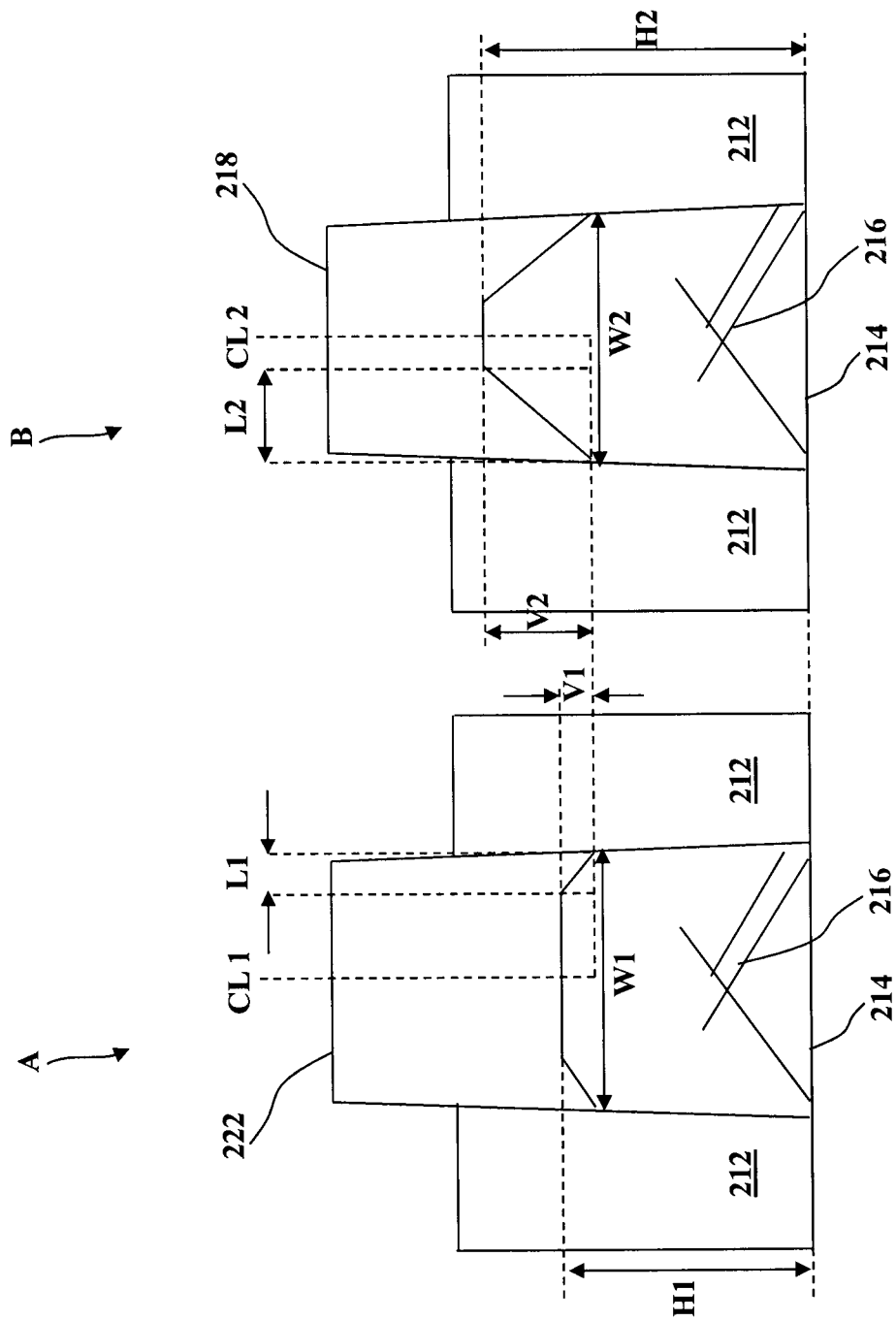

CMOS DEVICE AND METHOD OF FORMING THE SAME

PRIORITY DATA

The present application is a divisional application of U.S. patent application Ser. No. 13/473,149, filed May 16, 2012, which issued as U.S. Pat. No. 8,680,576, is incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-like field effect transistor (FinFET) devices. The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. Although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10A and 10B illustrate diagrammatic cross-sectional side views of areas A and B, respectively, of FIG. 9.

DETAILED DESCRIPTION

Figure 1:
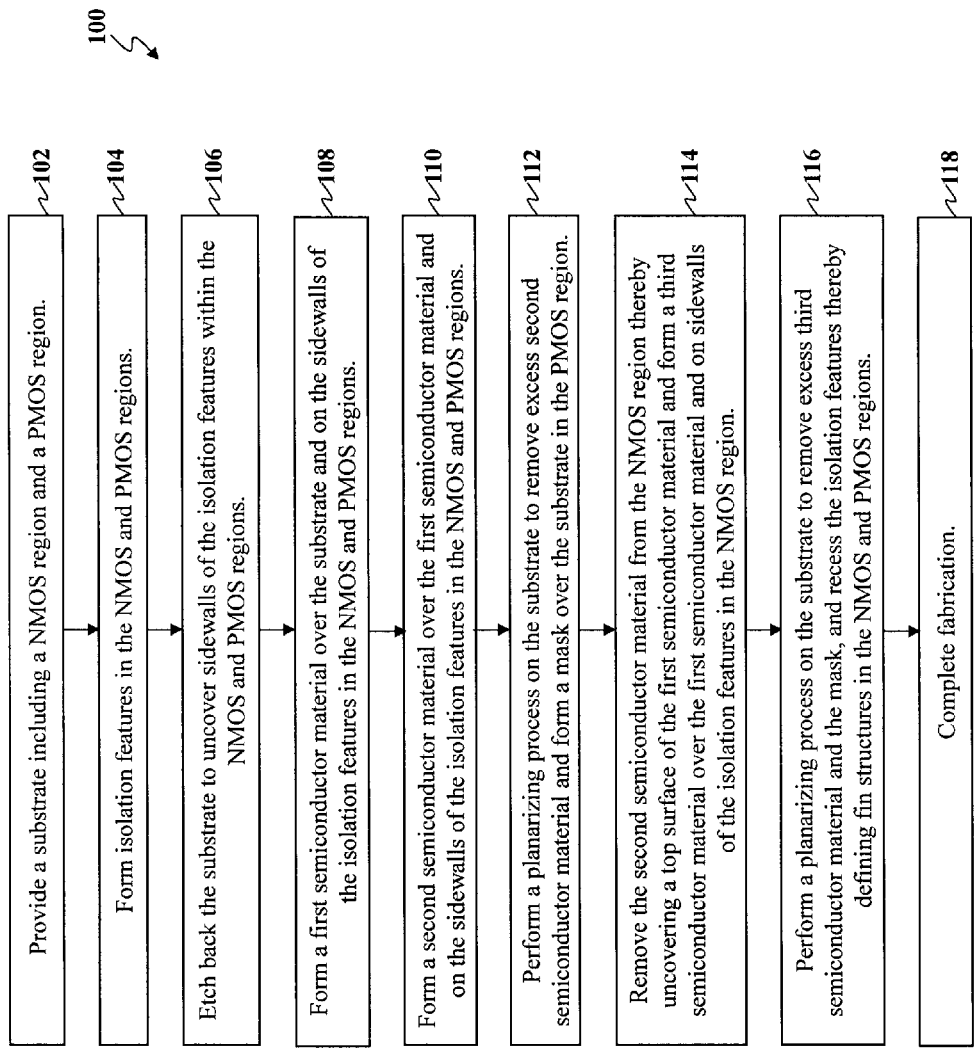
FIG. 1 is a flowchart illustrating a method of fabricating a semiconductor device according to various aspects of the present disclosure.

The following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present application.

Examples of devices that can benefit from one or more embodiments of the present application are semiconductor devices. Such a device, for example, is a fin-like field effect transistor (FinFET). The FinFET device, for example, may be a complementary metal-oxide-semiconductor (CMOS) device comprising a P-type metal-oxide-semiconductor (PMOS) FinFET device and a N-type metal-oxide-semiconductor (NMOS) FinFET device. The following disclosure will continue with a CMOS FinFET example to illustrate various embodiments of the present application. It is understood, however, that the application should not be limited to a particular type of device, except as specifically claimed.

With reference to FIGS. 1 and 2-9, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a CMOS FinFET device. The method 100 begins at block 102 where a substrate is provided. The substrate includes a NMOS region and a PMOS region. The method continues with block 104 where isolation features are formed in the NMOS and PMOS regions. The method continues with block 106 where the substrate is etched back to uncover sidewalls of the isolation features within the NMOS and PMOS regions. The method continues with block 108 where a first semiconductor material is formed over the substrate and on the sidewalls of the isolation features in the NMOS and PMOS regions. The method continues with block 110 where a second semiconductor material is formed over the first semiconductor material and on the sidewalls of the isolation features in the NMOS and PMOS regions. The method continues with block 112 where a planarizing process is performed on the substrate to remove excess second semiconductor material and a mask is formed over the substrate in the PMOS region. The method 100 continues with block 114 where the second semiconductor material is removed from the NMOS region thereby uncovering a top surface of the first semiconductor material and a third semiconductor material is formed over the first semiconductor material and on sidewalls of the isolation features in the NMOS region. Removing the second semiconductor material from the NMOS region includes removing part of the substrate in the NMOS region. The method continues with block 116 where a planarizing process is performed on the substrate to remove excess third semiconductor material and the mask, and the isolation features are etched back in the NMOS and PMOS regions, thereby defining fin structures in the NMOS and PMOS regions. The method 100 continues with block 118 where fabrication of the integrated circuit device is completed.

Completing the fabrication process may include, among other things, forming a gate stack over a channel region of the fin structure and forming source and drain (S/D) feature in a S/D region of the semiconductor device. Forming the gate stack may include a gate first or a gate last process. For example, in a gate first process, forming the gate stack may include depositing a dielectric layer over the fin structure, forming a gate structure (e.g., gate electrode) over the dielectric layer, and forming gate spacers on the walls of the gate structure and adjacent to the S/D region of the semiconductor device. Thereafter, a S/D feature may be formed in the S/D region by recessing the semiconductor material in the S/D region and depositing a doped semiconductor material in the S/D region. The deposition of the doped semiconductor material may include epi growing the semiconductor material. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

Figure 7:
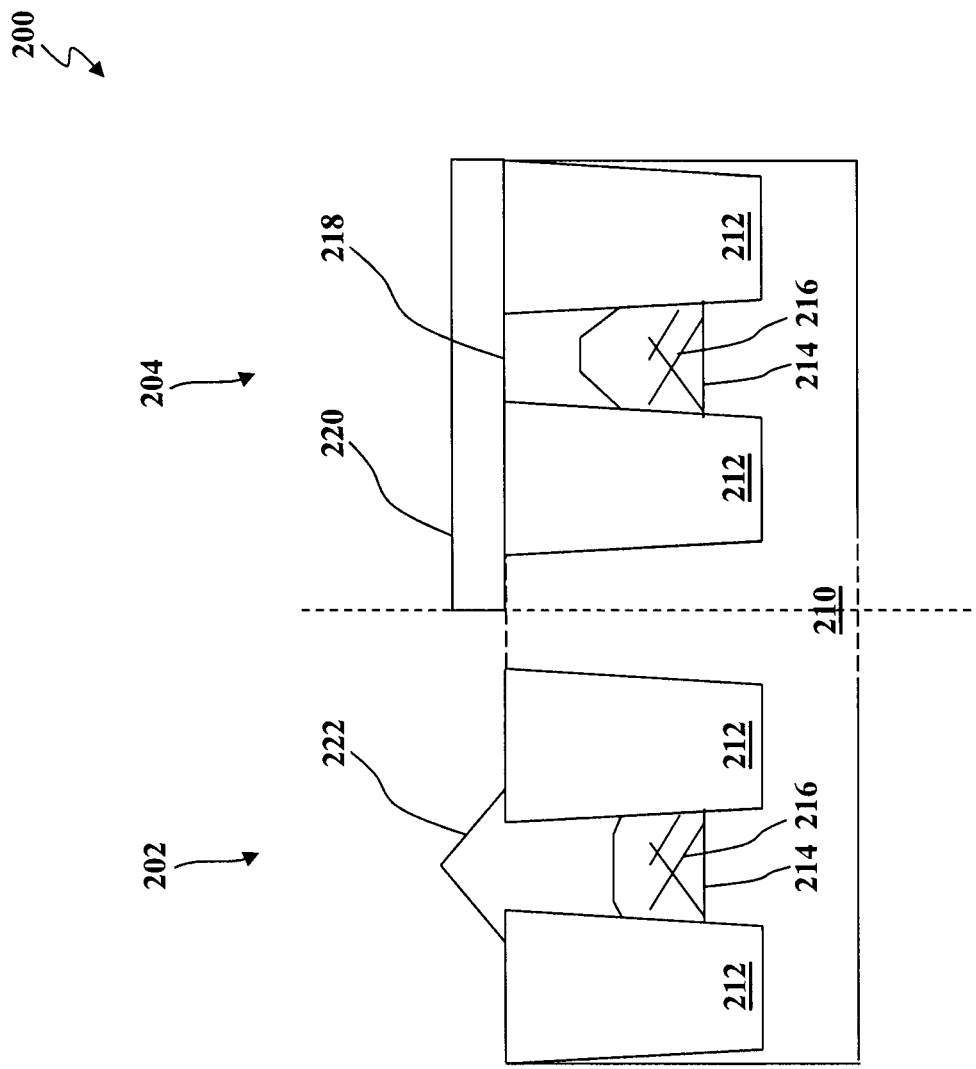
Figure 8:
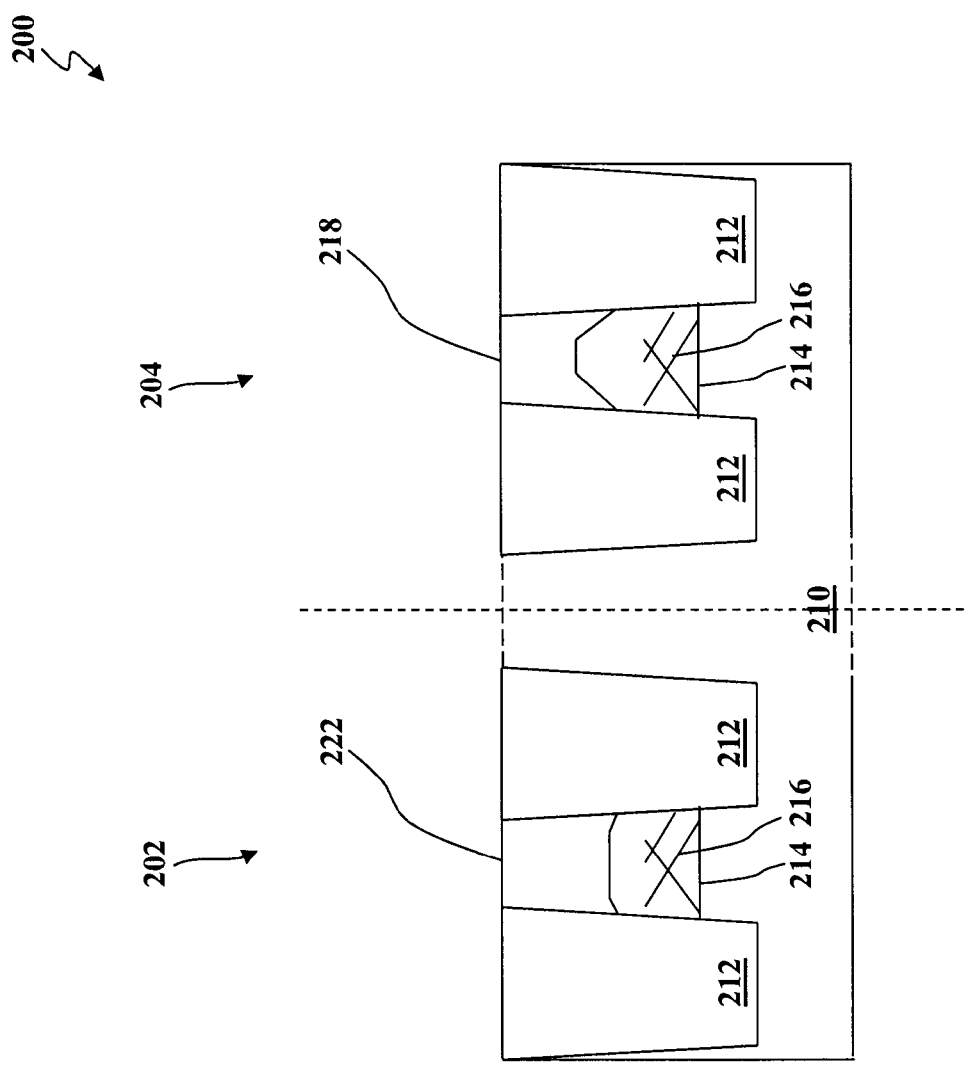
Figure 9:
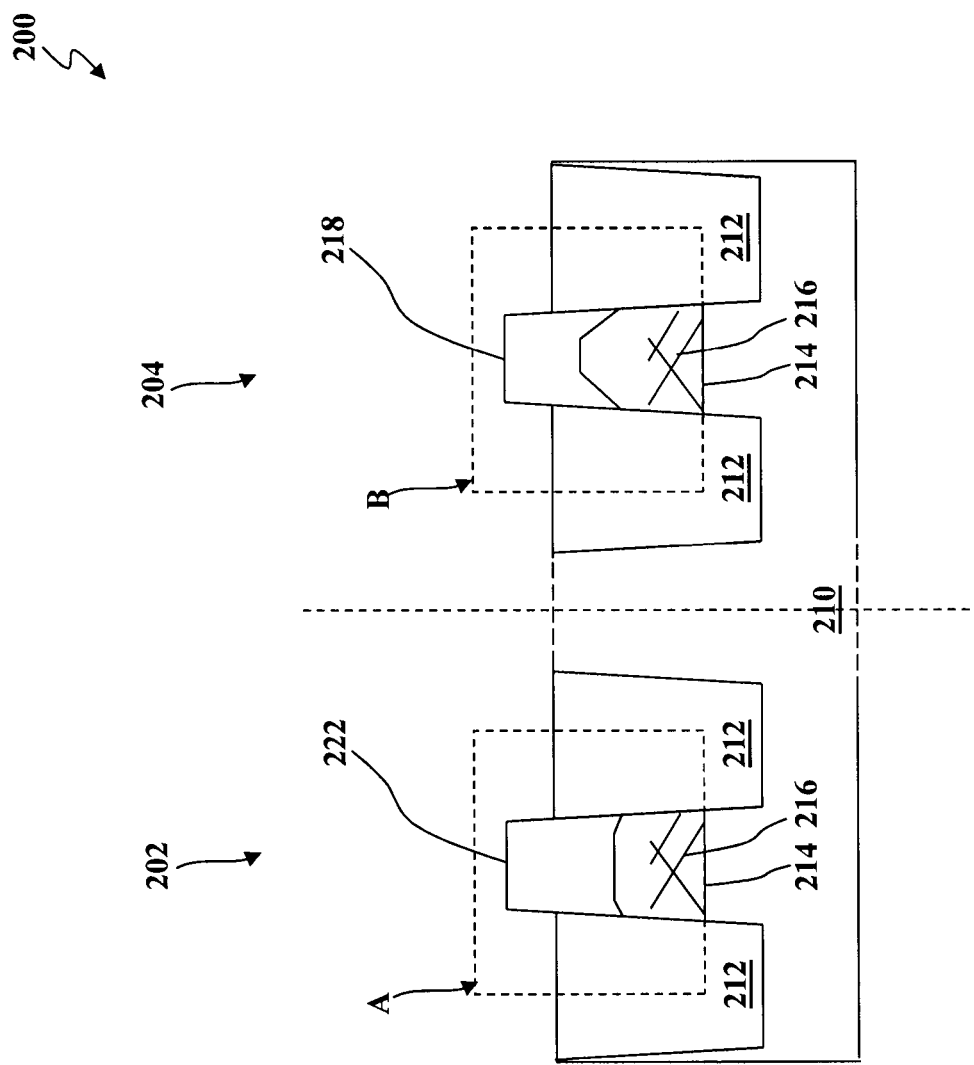

FIGS. 2-9 illustrate diagrammatic cross-sectional side views of one embodiment of a semiconductor device at various stages of fabrication, according to the method of FIG. 1; and FIGS. 10A and 10B illustrate diagrammatic cross-sectional side views of areas A and B, respectively, of FIG. 9. In the present disclosure, the semiconductor device is a CMOS FinFET device 200. The CMOS FinFET device 200 includes a NMOS region 202 and a PMOS region 204. The CMOS FinFET device 200 may be included in a microprocessor, memory cell, and/or other integrated circuit device. FIGS. 2-10 have been simplified for the sake of clarity to better understand the inventive concepts of the present disclosure. Additional features can be added in the CMOS FinFET device 200, and some of the features described below can be replaced or eliminated in other embodiments of the CMOS FinFET device 200.

Figure 2:
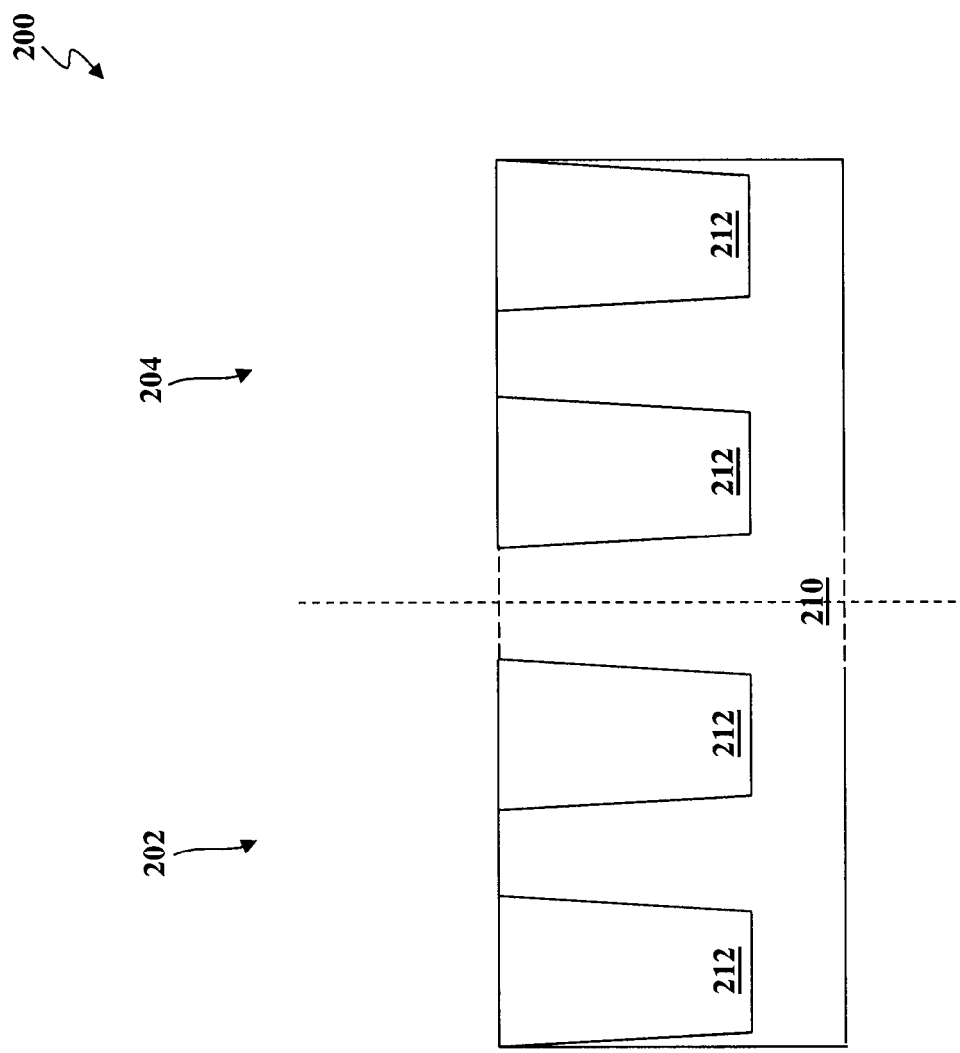
FIGS. 2-9 illustrate diagrammatic cross-sectional side views of one embodiment of a semiconductor device at various stages of fabrication, according to the method of FIG. 1.

Referring to FIG. 2 the CMOS FinFET device 200 includes a substrate 210. The substrate 210 is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

Still referring to FIG. 2, formed within the substrate 210 are isolation features 212 to isolate various regions of the substrate 210, and in the present embodiment, to isolate the NMOS and PMOS regions, 202 and 204. The isolation features 212 utilize isolation technology, such as local oxidation of silicon (LOCOS), shallow trench isolation (STI), or any suitable isolation technology, to define and electrically isolate the various regions. In the present embodiment the isolation features 212 are STI features.

The isolation features 212 may be formed by any suitable process. Forming the isolation features 212 includes, for example, forming a plurality of openings (or trenches) within the substrate 210. Forming the openings (or trenches) may include exposing a photoresist layer to a pattern, performing a post-exposure bake process, and developing the photoresist layer to form a masking element. In some embodiments, the photoresist layer patterning may include processing steps of photoresist coating, soft baking, mask aligning, exposing pattern, post-exposure baking, developing photoresist, and hard baking. In some embodiments, the patterning can also be implemented or replaced by other proper methods, such as maskless photolithography, electron-beam writing, ion-beam writing, and molecular imprint.

After the photoresist layer has been patterned the substrate 210 is etched using the patterned photoresist to form the plurality of openings (or trenches). The etching process may include a wet etching process, a dry etching process, or a combination thereof. The etching process may use a reactive ion etch (RIE) and/or other suitable process. In one example, a dry etching process used to etch the substrate 210 includes a fluorine-containing gas chemistry such as $CF_4$, $SF_6$, $NF_3$, or any suitable gas. After forming the plurality of openings (or trenches) within the substrate 210, the photoresist layer is removed by any suitable process. For example, the photoresist layer may be removed by a liquid "resist stripper", which chemically alters the resist so that it no longer adheres to the underlying hard mask. Alternatively, the photoresist layer may be removed by a plasma containing oxygen, which oxidizes it.

An insulation material is deposited thereafter within the plurality of openings (or trenches) within the substrate 210 thereby forming isolation features 212. As an example, the insulation material includes a dielectric material. The dielectric material includes a material such as silicon oxide, silicon nitride, silicon oxynitride, low k materials, air gap, other suitable material, or any combinations thereof. The insulation material can be deposited by a CVD process. In various examples, the insulation material can be formed by atomic layer deposition (ALD), high density plasma CVD (HD-PCVD), other suitable methods, and/or combinations thereof. The insulation material may be alternatively formed by a high aspect ratio process (HARP). The CVD process, for example, can use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). In some embodiments, the insulation material can have a multi-layer structure, for example, a thermal oxide liner layer with silicon nitride or silicon oxide formed over the liner. After the formation of the isolation features 212, a planarizing process is performed on the CMOS FinFET device 200 to remove excess portions of the insulation material. In one embodiment, the planarizing process includes a chemical mechanical polishing (CMP) process.

Figure 3:
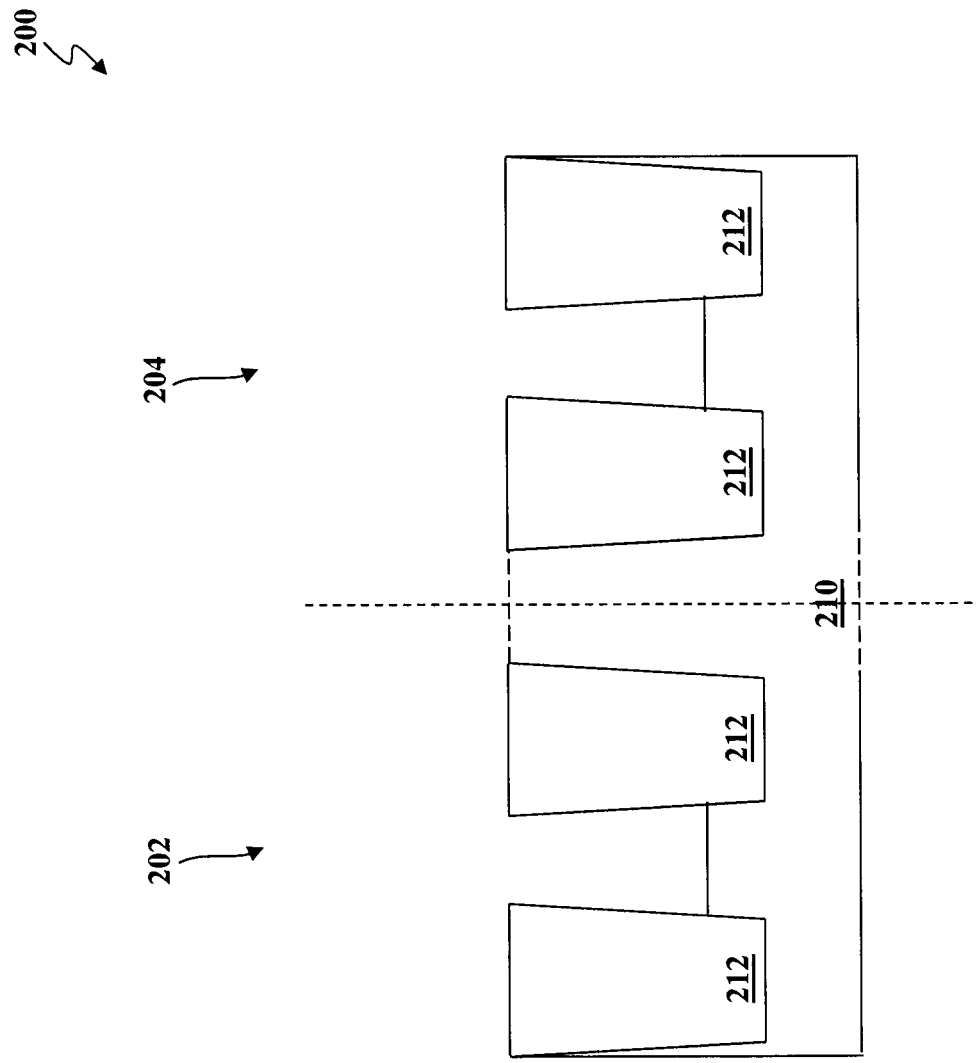

Referring to FIG. 3, the substrate 210 is recessed between the isolation features 212 in the NMOS region 202 and the PMOS region 204, thereby uncovering sidewalls of the isolation features 212. Recessing the substrate 210 may include any suitable process. In the present embodiment, for example, recessing the substrate 210 includes an etching process. The etching process may include a wet etching process, a dry etching process, or a combination thereof. In one example, a dry etching process is used to etch the substrate 210 includes a fluorine-containing gas.

Figure 4:
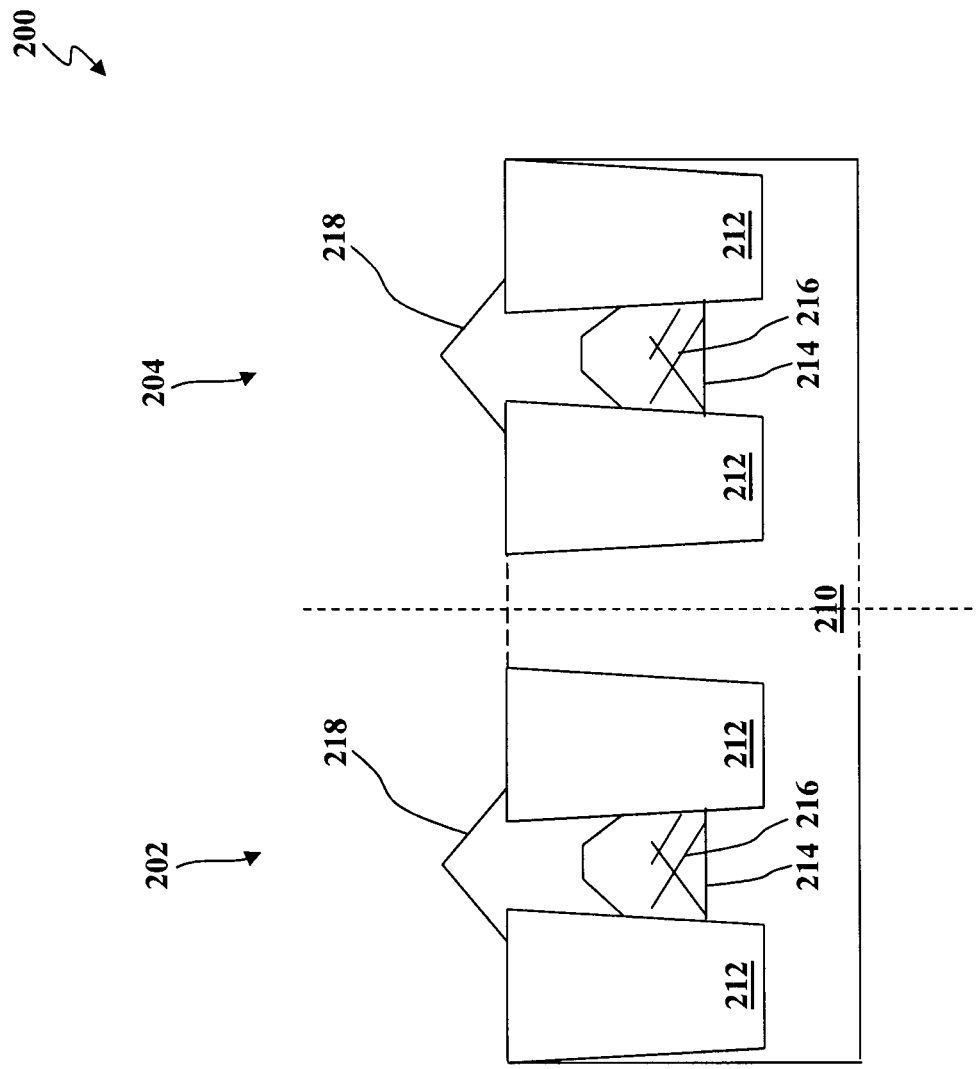

Referring to FIG. 4, a buffer layer 214 is formed. The buffer layer 214 provides a buffer/transition from the material of the substrate 210 to the material of the fin structure that will be subsequently formed. Forming the buffer layer 214 may include epitaxially (epi) growing a semiconductor material over the substrate 210 and between the isolation features 212 in the NMOS region 202 and the PMOS region 204.

The semiconductor material of the buffer layer 214 may include any suitable semiconductor material. In the present embodiment, the semiconductor material of the buffer layer 214 includes silicon germanium (SiGe). As an example, the concentration of germanium may range from about 45% to about 55%, from about 25% to about 75%, or may be any suitable concentration. In the present embodiment, the semiconductor material of the buffer layer 214 includes a concentration of germanium of about 50% (i.e., $Si_{0.5}Ge_{0.5}$). The semiconductor material of the buffer layer 214 (e.g., SiGe) has a first lattice constant which is different from a lattice constant of the material of the substrate 210 (e.g., Si).

In the present embodiment, the semiconductor material of the buffer layer 214 is relaxed as the stress (which results from lattice mismatch between the substrate 210 and the buffer layer 214) is released by the formation of dislocations 216 within the crystal structure of the semiconductor material of the buffer layer 214. As an example, the dislocations 216 may be formed by tuning parameters, such as temperature and pressure, during the epi-growth process or by recrystallizing the epi-grown semiconductor material by a process that includes an annealing process. The epi-growth process used to deposit the semiconductor material of the buffer layer 214 results in the formation of facets (angled portions in the [111] direction having an angle from about 50 degrees to about 60 degrees) on the top surface of the buffer layer 214.

Still referring to FIG. 4, a fin structure 218 is formed over the buffer layer 214. The fin structure 218 may be formed by any suitable process. As an example, forming the fin structure 218 includes epitaxially (epi) growing a semiconductor material over the buffer layer 214 and between the isolation features 212 in the NMOS region 202 and the PMOS region 204. The semiconductor material of the fin structure 218 may include any suitable semiconductor material. As an example, in the present embodiment, the semiconductor material of the fin structure 218 includes germanium (Ge).

The semiconductor material of the fin structure 218 has a second lattice constant which is different from the first lattice constant of the semiconductor material of the buffer layer 214. In the present embodiment, the second lattice constant of the semiconductor material of the fin structure 218 (e.g., Ge) is greater than the first lattice constant of the semiconductor material of the buffer layer 214 (e.g., SiGe). Due to the lattice mismatch, the fin structure 218 experiences compressive stress which results from lattice mismatch.

Figure 5:
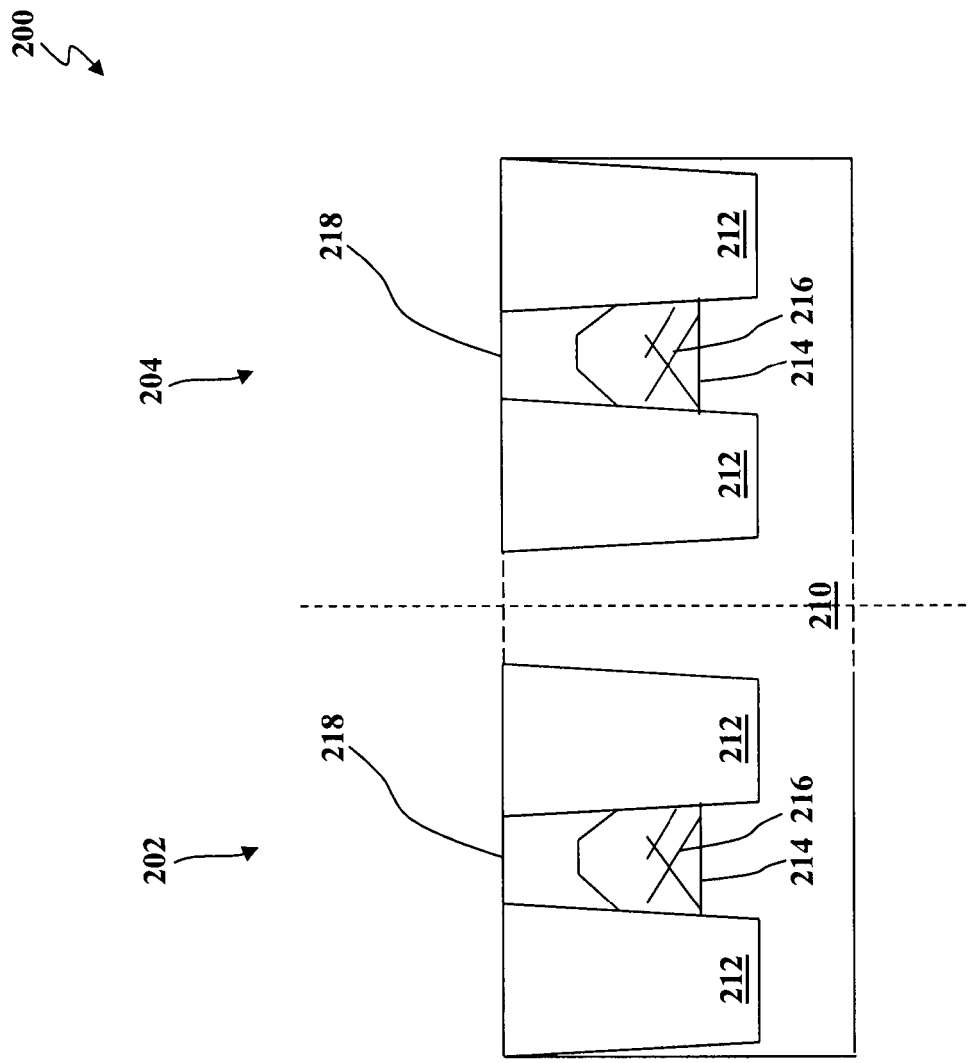

Referring to FIG. 5, a planarizing process is performed on the CMOS FinFET device 200 to remove excess portions of the semiconductor material of the fin structure 218. As an example, the planarizing process includes a chemical mechanical polishing (CMP) process.

Figure 6:
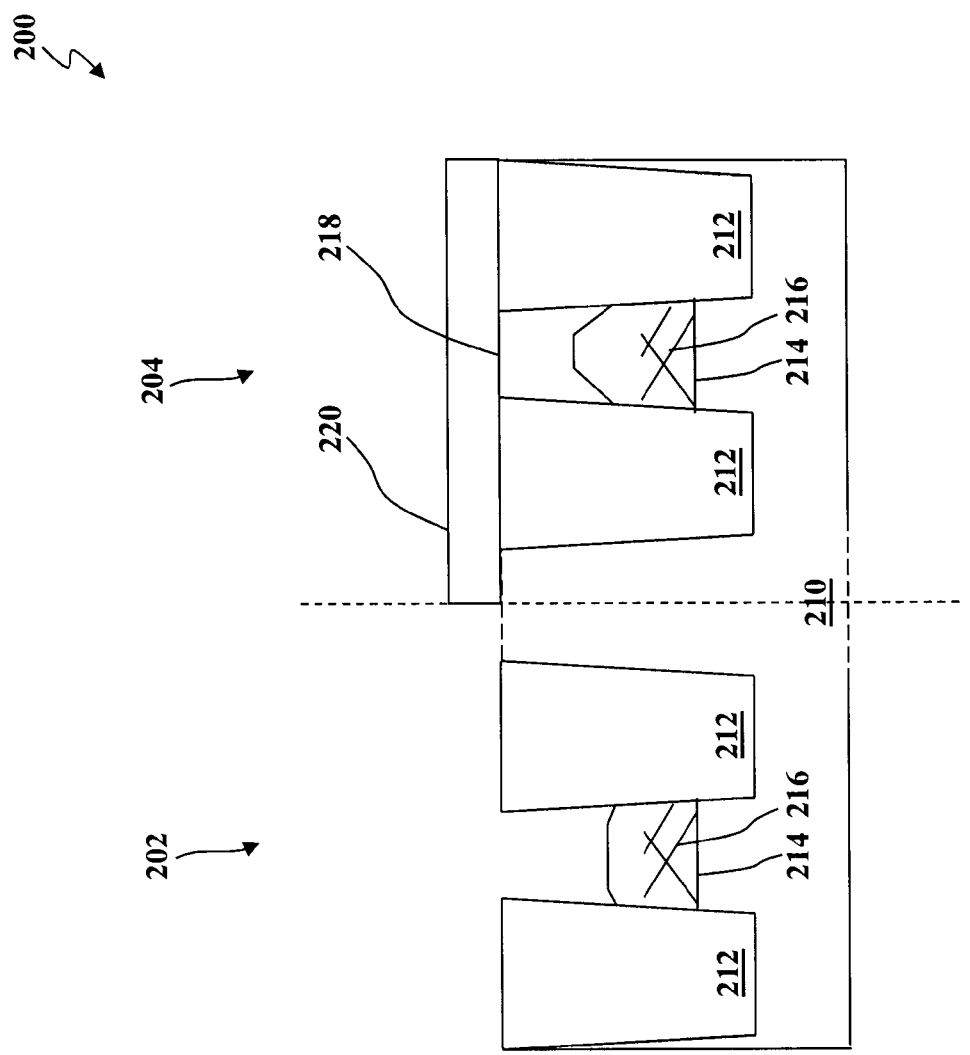

Referring to FIG. 6, a mask 220 is formed over the PMOS region 204. The mask 220 may include a hard mask and/or a photoresist. As an example, the mask 204 may be formed by any suitable process to any suitable thickness. In the present embodiment, the mask 220 is a hard mask formed by a CVD process. In various examples, the mask 220 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6). The mask 220 may be patterned, such that it is only over the PMOS region 204, by any suitable process such as a photolithography and etching process. The photolithography process, for example, may include depositing a photoresist layer, exposing the photoresist layer to a pattern, performing a post-exposure bake process, developing the photoresist layer, and etching the mask 220 with the patterned photoresist layer.

After forming the mask 220, the semiconductor material of the fin structure 218 and a top portion of the buffer layer 214 (including all or part of the facets of the buffer layer 214) are removed from the NMOS region 202. As an example, removing the semiconductor material of the fin structure 218 and part of the buffer layer 214 includes an etching process. The etching process may include a wet etching process, a dry etching process, or a combination thereof. In one example, a dry etching process is used to etch the semiconductor material of the fin structure 218 and the top portion of the buffer layer 214 includes a fluorine-containing gas. As will be described in greater detail below, the removal of part of the top portion of the buffer layer 214 results in an asymmetry in the buffer layer 214 of the NMOS region 202 and the buffer layer 214 of the PMOS region 204.

Referring to FIG. 7, a fin structure 222 is formed over the buffer layer 214 in the NMOS region 202. The fin structure 222 may be formed by any suitable process. As an example, forming the fin structure 222 includes epitaxially (epi) growing a semiconductor material over the buffer layer 214 and between the isolation features 212 in the NMOS region 202. The semiconductor material of the fin structure 222 may include any suitable semiconductor material. As an example, in the present embodiment, the semiconductor material of the fin structure 218 includes silicon (Si).

The semiconductor material of the fin structure 222 has a third lattice constant which is different from the first lattice constant of the semiconductor material of the buffer layer 214 and different from the second lattice constant of the semiconductor material of the fin structure 218 of the PMOS region 204. In the present embodiment, the third lattice constant of the semiconductor material of the fin structure 222 (e.g., Si) is less than the first lattice constant of the semiconductor material of the buffer layer 214 (e.g., SiGe) and less than the second lattice constant of the fin structure 218 (e.g., Ge). Due to the lattice mismatch, the fin structure 222 experiences tensile stress.

Referring to FIG. 8, a planarizing process is performed on the CMOS FinFET device 200 to remove excess portions of the semiconductor material of the fin structure 222 and the mask 220. As an example, the planarizing process includes a chemical mechanical polishing (CMP) process. In alternative embodiments, the mask 220 is removed by a separate process.

Referring to FIG. 9, the isolation features 212 are recessed to thereby defining fin structures in the NMOS and PMOS regions, 202 and 204, respectively. The isolation features may be recessed by and etch-back process. The etch-back process may include a wet etching process, a dry etching process, or a combination thereof.

Referring to FIGS. 10A and 10B, illustrated are diagrammatic cross-sectional side views of areas A and B, respectively, of FIG. 9. With reference to FIG. 10A, area A includes a NMOS device including a buffer layer 214 including dislocations 216 operable to relax the stress in the buffer layer 214. The buffer layer 214 has width W1, a top surface that includes two facets (in the [111] direction) having a longitudinal dimension L1, and a vertical dimension V1. In the present embodiment, the value of L1 is less than about 25% of the value of the width W1 and the value of V1 is less than about 20% of the value of the width W1. As an example, the width W1 may be about 15 nm, the longitudinal dimension L1 may be less than about 3.75 nm, and the vertical dimension V1 may be less than about 3 nm. In the present embodiment, the width W1 is about 10 nm, the longitudinal dimension L1 is less than about 2.5 nm, and the vertical dimension V1 is less then about 2 nm. In alternative embodiments, the buffer layer 214 has a substantially flat top surface that is free of facets. It is understood that the above dimensions are merely exemplary and that as the size of the device increases or decreases the respective dimensions (e.g., W1, L1, and V1) will increase or decrease respectively and proportionally. For example, if the size of the device doubles, the width W1 of the buffer layer 214 in present embodiment doubles and the respective range values of the longitudinal dimension L1 and the vertical dimension V1 of the facets of the buffer layer 214 of the NMOS device will likewise double.

With reference to FIG. 10B, area B includes a PMOS device including a buffer layer 214 including dislocations 216 operable to relax the stress in the buffer layer 214. The buffer layer 214 has width W2, a top surface that includes two facets (in the [111] direction) having a longitudinal dimension L2, and a vertical dimension V2. In the present embodiment, the value of the vertical dimension V2 may be less than about 60% of the value of the width W2 and the value of the longitudinal dimension L2 may be less than about 50% of the value of the width W2. As an example, the width W2 may be about 15 nm, the longitudinal dimension L2 may be less than about 9 nm, and the vertical dimension V2 is less than about 7.5 nm. In the present embodiment, the width W2 is about 10 nm, the longitudinal dimension L2 ranges from about 4.5 nm to about 2.5 nm, and the vertical dimension V2 is less than about 5 nm. In certain embodiments, the buffer layer 214 has a substantially pointy top surface that comprises two facets and is free of a flat top potion. It is understood that the above dimensions are merely exemplary and that as the size of the device increases or decreases the respective dimensions (e.g., W2, L2, and V2) will increase or decrease respectively and proportionally. For example, if the size of the device doubles, the width W2 of the buffer layer 214 in present embodiment doubles and the respective range values of the longitudinal dimension L2 and the vertical dimension V2 of the facets of the buffer layer 214 of the PMOS device will likewise double.

As illustrated in FIGS. 10A and 10B, there is an asymmetry that exists in the top portions (including the facets) of the buffer layer 214 of the NMOS and PMOS devices that has resulted from the above processing steps of method 100. Further, the buffer layer 214 of the NMOS device includes a total height H1 less than a total height H2 of the buffer layer 214 of the PMOS device.

It is understood that although the present embodiments, for simplicity, have illustrated only one NMOS device and only one PMOS device, any number of such devices may be formed within the CMOS FinFET device 200. Further, it is understood that although the above method 100 processes the PMOS region 204 first (e.g., by first forming fin 218 of the PMOS device, masking the PMOS region 204, and then etching and forming the fin 222 of the NMOS device), the embodiments of the present disclosure may be equally applicable to alternative embodiments where the NMOS region 202 is processed first (e.g., by first forming fin 222 of the NMOS device, masking the NMOS region 204, and then etching and forming the fin 218 of the PMOS device). In such alternative embodiments, the PMOS device will have the dimensions of area A and the NMOS device will have the dimensions of area B as illustrated in FIGS. 10A and 10B.

The CMOS FinFET device 200 may include additional features, which may be formed by subsequent processing. For example, subsequent processing may further form various contacts/vias/lines and multilayer interconnect features (e.g., metal layers and interlayer dielectrics) on the substrate, configured to connect the various features or structures of the device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structures. In another embodiment, tungsten is used to form tungsten plugs in the contact holes.

The disclosed semiconductor device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The above method 100 provides for a unique CMOS FinFET device 200 and significantly minimizes the steps of manufacturing, when compared to traditional methods of manufacturing, without adversely affecting device performance. For example, because the method 100 provides for process steps that are simultaneously applied to both the NMOS region 202 and the PMOS region 204 of the CMOS FinFET device 200, additional steps of patterning and multiple separate etching steps are avoided. Thus, the disclosed embodiments provide for a unique CMOS FinFET device 200 and method 100 that minimizes cycle time and provides for significant cost savings during the manufacturing process. It is understood that different embodiments may have different advantages, and that no particular advantage is necessarily required of any embodiment.

Thus, provided is a semiconductor device. The exemplary semiconductor device includes a substrate including a first region and a second region. The semiconductor device further includes a first buffer layer formed over the substrate and between first and second isolation regions in the first region and a second buffer layer formed over the substrate and between first and second isolation regions in the second region. The semiconductor device further includes a first fin structure formed over the first buffer layer and between the first and second isolation regions in the first region and a second fin structure formed over the second buffer layer and between the first and second isolation regions in the second region. The first buffer layer includes a top surface different from a top surface of the second buffer layer.

In some embodiments, the semiconductor device further includes first dislocations features formed within the first buffer layer operable to relax the first buffer layer; and second dislocations features formed within the second buffer layer operable to relax the second buffer layer.

In some embodiments, the first buffer layer includes a first lattice constant, the second buffer layer includes a second lattice constant, the first and second lattice constants are substantially the same; the first fin structure includes a third lattice constant less than the first and second lattice constants; and the second fin structure includes a fourth lattice constant greater than the first and second lattice constants. In various embodiments, the first buffer layer includes first facets having a vertical dimension of less than about 20% of a width of the first fin structure and a longitudinal dimension of less than about 25% of the width of the first fin structure and the second buffer layer includes second facets having a vertical dimension of less than about 50% of a width of the second fin structure and a longitudinal dimension ranging from about 45% to about 25% of the width of the second fin structure. In certain embodiments, the first buffer layer is substantially facet free, and the second buffer layer includes facets having a vertical dimension less than about 5 nm and a longitudinal dimension less than about 4.5 nm. In further embodiments, the first region is a NMOS region, and the second region is a PMOS region. In still further embodiments, the first region is a PMOS region, and the second region is a NMOS region.

Also provided is another semiconductor device. The semiconductor device includes a substrate including a first region and a second region. The semiconductor device further includes isolation features formed within the substrate in the first and second regions. The semiconductor device further includes a buffer layer formed over the substrate and between the isolation features in the first and second regions. The semiconductor device further includes a first semiconductor material formed over the buffer layer and between the isolation features in the first region and a second semiconductor material formed over the buffer layer and between the isolation features in the second region, the second semiconductor material being different from the first semiconductor material. The buffer layer in the first region includes a total height different from a total height of the buffer layer in the second region.

In some embodiments, the semiconductor device further includes dislocations features formed within the buffer layer operable to relax the buffer layer in the first and second regions.

In some embodiments, the first semiconductor material is in tensile stress, and the second semiconductor material is in compressive stress. In various embodiments, the substrate includes a first lattice constant, the buffer layer includes a second lattice constant greater than the first lattice constant, the first semiconductor includes a third lattice constant less than the second lattice constant, and the second semiconductor material includes a fourth lattice constant greater than the second lattice constant. In certain embodiments, the substrate includes silicon (Si), the buffer layer includes silicon germanium (SiGe), the first semiconductor material includes silicon (Si), and the second semiconductor material includes germanium (Ge). In further embodiments, the total height of the buffer layer in the first region is less than the total height of the buffer layer in the second region. In some embodiments, the total height of the buffer layer in the first region is greater than the total height of the buffer layer in the second region. In various embodiments, the buffer layer in the first region includes facets having a vertical dimension less than about 2 nm and a longitudinal dimension less than about 2.5 nm, and the buffer layer in the second region includes facets having a vertical dimension ranging from about 5 nm to about 2 nm and a longitudinal dimension ranging from about 4.5 nm to about 2.5 nm.

Also provided is a method. The method includes providing a substrate including a NMOS region and a PMOS region. The method further includes forming isolation features within the substrate in the NMOS and PMOS regions. The method further includes recessing the substrate between the isolation features in the NMOS and PMOS regions. The method further includes forming a buffer layer over the recessed substrate and between the isolation features in the NMOS and PMOS regions. The method further includes forming a first semiconductor material over the buffer layer in the NMOS and PMOS regions. The method further includes removing the first semiconductor material and a top portion of the buffer layer in the NMOS region. The method further includes forming a second semiconductor material over the buffer layer in the NMOS region. The method further includes recessing the isolation features thereby defining fin structures in the NMOS and PMOS regions.

In some embodiments, the method further includes forming dislocations within the buffer layer operable to reduce stress within the buffer layer.

In some embodiments, removing the first semiconductor material and a top portion of the buffer layer in the NMOS region includes: forming a mask over the semiconductor device; and etching the first semiconductor material and the top portion of the buffer layer in the NMOS region using the mask. In various embodiments, etching the top portion of the buffer layer in the NMOS region reduces a vertical dimension of a facet in the NMOS region to less than about 2 nm. In further embodiments, the buffer layer in the PMOS region includes a facet having a vertical dimension of less than about 5 nm, and the vertical dimension of the facet in the PMOS region is greater than the vertical dimension of the facet in the NMOS region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   providing a semiconductor substrate including a first region and a second region;
   forming first and second dielectric isolation features in the first region;
   forming a first buffer layer between the first and second dielectric isolation features in the first region, the first buffer layer having a first width;
   forming third and fourth dielectric isolation features in the second region;
   forming a second buffer layer between the third and fourth dielectric isolation features in the second region, the second buffer layer having a second width different from the first width of the first buffer layer;
   forming a first fin structure over the first buffer layer and between the first and second isolation features in the first region; and
   forming a second fin structure over the second buffer layer and between the third and fourth isolation features in the second region.

2. The method of claim 1 further comprising:
   forming first dislocation features within the first buffer layer operable to relax the first buffer layer; and
   forming second dislocation features within the second buffer layer operable to relax the second buffer layer.

3. The method of claim 1 wherein the first buffer layer includes a first lattice constant,
   wherein the second buffer layer includes a second lattice constant,
   wherein the first and second lattice constants are substantially the same,
   wherein the first fin structure includes a third lattice constant less than the first and second lattice constants, and
   wherein the second fin structure includes a fourth lattice constant greater than the first and second lattice constants.

4. The method of claim 1 wherein the first buffer layer includes first facets having a vertical dimension of less than about 20% of a width of the first fin structure and a longitudinal dimension of less than about 25% of the width of the first fin structure, and wherein the second buffer layer includes second facets having a vertical dimension of less than about 50% of a width of the second fin structure and a longitudinal dimension ranging from about 45% to about 25% of the width of the second fin structure.

5. The method of claim 1 wherein the first buffer layer is substantially facet free, and wherein the second buffer layer includes facets.

6. The method of claim 4 wherein the first region is a PMOS region, and wherein the second region is a NMOS region.

7. The method of claim 5 wherein the first region is a NMOS region, and wherein the second region is a PMOS region.

8. A method of forming a semiconductor device, comprising:

forming isolation features in first and second regions of a substrate;

forming a buffer layer between the isolation features in the first and second regions, the buffer layer in the first region including first facets different from second facets of the buffer layer in the second region;

forming a first semiconductor material over the buffer layer and between the isolation features in the first region; and forming a second semiconductor material over the buffer layer and between the isolation features in the second region, the second semiconductor material being different from the first semiconductor material.

9. The method of claim 8 further comprising:

forming dislocations features within the buffer in the first and second regions.

10. The method of claim 8 wherein the first semiconductor material is in tensile stress, and wherein the second semiconductor material is in compressive stress.

11. The method of claim 9 wherein the substrate includes a first lattice constant, wherein the buffer layer includes a second lattice constant greater than the first lattice constant, wherein the first semiconductor includes a third lattice constant less than the second lattice constant, and wherein the second semiconductor material includes a fourth lattice constant greater than the second lattice constant.

12. The method of claim 9 wherein the substrate includes silicon (Si), wherein the buffer layer includes silicon germanium (SiGe), wherein the first semiconductor material includes silicon (Si), and wherein the second semiconductor material includes germanium (Ge).

13. The method of claim 8 wherein the total height of the buffer layer in the first region is less than the total height of the buffer layer in the second region.

14. The semiconductor device of claim 11 wherein the total height of the buffer layer in the first region is greater than the total height of the buffer layer in the second region.

15. The method of claim 8 wherein the buffer layer in the first region includes facets having a vertical dimension less than about 2 nm, and wherein the buffer layer in the second region includes facets having a vertical dimension ranging from about 2 nm to about 5 nm.

16. A method of forming semiconductor device, comprising:

providing a substrate including a NMOS region and a PMOS region;

forming isolation features within the substrate in the NMOS and PMOS regions;

recessing the substrate between the isolation features in the NMOS and PMOS regions;

forming a buffer layer over the recessed substrate and between the isolation features in the NMOS and PMOS regions;

forming a first semiconductor material over the buffer layer in the NMOS and PMOS regions;

removing the first semiconductor material and a top portion of the buffer layer in the NMOS region;

forming a second semiconductor material over the buffer layer in the NMOS region; and recessing the isolation features thereby defining fin structures in the NMOS and PMOS regions.

17. The method of claim 16 further comprising:

forming dislocations within the buffer layer in the NMOS and PMOS regions, wherein the dislocations are operable to reduce stress within the buffer layer.

18. The method of claim 17 wherein removing the first semiconductor material and a top portion of the buffer layer in the NMOS region includes:

forming a mask over the semiconductor device; and etching the first semiconductor material and the top portion of the buffer layer in the NMOS region using the mask.

19. The method of claim 18 wherein etching the top portion of the buffer layer in the NMOS region reduces a vertical dimension of a facet in the NMOS region to less than about 2 nm.

20. The method of claim 19 wherein the buffer layer in the PMOS region includes a facet having a vertical dimension of less than about 5 nm, wherein the vertical dimension of the facet in the PMOS region is greater than the vertical dimension of the facet in the NMOS region.

* * * * *